United States Patent [19]
Suzuki et al.

[11] Patent Number: 5,900,653
[45] Date of Patent: May 4, 1999

[54] HIGH ELECTRON MOBILITY TRANSISTOR HAVING THIN, LOW RESISTANCE SCHOTTKY CONTACT LAYER

[75] Inventors: Toshifumi Suzuki; Yamato Ishikawa, both of Wako, Japan

[73] Assignee: Honda Giken Kogyo Kabushiki Kaisha, Tokyo, Japan

[21] Appl. No.: 08/839,743

[22] Filed: Apr. 15, 1997

[30] Foreign Application Priority Data

Apr. 18, 1996 [JP] Japan ................................ 8-120974

[51] Int. Cl.$^6$ ............................................. H01L 29/778
[52] U.S. Cl. .............................................................. 257/194
[58] Field of Search .................................... 257/194, 192

[56] References Cited

U.S. PATENT DOCUMENTS

| Re. 33,584 | 5/1991 | Mimura | 257/194 |
|---|---|---|---|
| 4,943,438 | 7/1990 | Miyamoto | 257/192 |
| 5,060,030 | 10/1991 | Hoke | 257/194 |
| 5,140,386 | 8/1992 | Huang et al. | 257/194 |

FOREIGN PATENT DOCUMENTS 1-56542  9/1986  Japan .

OTHER PUBLICATIONS

A. Küsters, et al., "Double–Heterojunction Lattice–Matched and Pseudomorphic InGaAs HEMT with delta–Doped InP Supply Layers and p–InP Barrier Enhancement Layer Grown by LP–MOVPE," IEEE Electron Device Letters, vol. 14, No. 1, 1993, pp. 36–39.

C.S. Wu, et al., "High Efficiency Microwave Power AlGaAs/InGaAs PHEMT's Fabricated by Dry Etch Single Gate Recess," IEEE Transactions on Electon Devices, vol. 42, No. 8, 1995, pp. 1419–1424.

P. C. Chao, et al., "W–Band Low–Noise InAlAs/InGaAs Lattice–Matched HEMT's," IEEE Electron Device Letters, vol. 11, No. 1, 1990, pp. 59–62.

T. Ishikawa, et al., "Improvement of Two–Dimensional Electron Gas Concentration in Selectively Doped GaAs/N–AlGaAs Heterostructure by Atomic Planar Doping," Journal of Applied Physics, vol. 61, No. 5, 1987, pp. 1937–1940.

*Primary Examiner*—John Guay
*Attorney, Agent, or Firm*—Lyon & Lyon LLP

[57] ABSTRACT

A high electron mobility transistor has a double-heterojunction structure including a channel layer for developing therein an electron gas layer having a substantially uniform electron gas density, and upper and lower high-resistance wide-band gap layers disposed respectively over and beneath the channel layer. Each of the upper and lower high-resistance wide-band gap layers has a silicon-doped planar layer disposed therein. The upper high-resistance wide-band gap layer including a low-resistance wide-band gap layer disposed in an upper end region thereof remotely from the channel layer.

5 Claims, 2 Drawing Sheets

HIGH ELECTRON MOBILITY TRANSISTOR HAVING THIN, LOW RESISTANCE SCHOTTKY CONTACT LAYER

BACKGROUND OF THE INVENTION

1. Field of the Invention

The present invention relates to a high electron mobility transistor (HEMT) for use in a high-frequency amplifier or the like.

2. Description of the Prior Art

A field-effect transistor (FET) having a superlattice structure which was first disclosed by Mr. Mimura of Fujitsu Limited. is known as HEMT (see U.S. Pat. No. Re. 33,584), and is widely used as an essential circuit component in portable telephone sets.

Although the conventional HEMT disclosed by Mr. Mimura has excellent high-frequency characteristics, it suffers a limitation as to frequencies which it can handle, and cannot be used in a millimeter-wave band of frequencies ranging from 60 GHz to 94 GHz.

In view of a report issued by the FCC (Federal Communications Commission) in the U.S.A. on the allocation of automotive millimeter-wave radar frequencies, the assignee of the present application has launched a project for the development of a semiconductor that can be used in a 77 GHz band of frequencies for use by automotive millimeter-wave radars in the U.S.A. The HEMT structure dislosed by Mr. Mimura is unable to handle such a 77 GHz frequency band. As a result, there has been proposed a pseudomorphic-HEMT which employs InGaAs for an FET channel for improved frequency characteristics as disclosed in U.S. patent application Ser. No. 08-565295 filed on Nov. 30, 1995.

The above U.S. patent application reveals a high-performance high electron mobility transistor which has a channel layer whose thickness is limited to a value small enough to substantially uniformize the density of an electron gas in the transverse direction of the channel layer, and which also has upper and lower wide-band-gap layers comprising AlGaAs layers of high resistance. With the disclosed structure, the HEMT has its mutual conductance variable to a small degree depending on the gate voltage.

Specifically, if the channel layer is thick, then a two-dimensional electron gas layer developed in the channel layer is localized in the vicinity of the heterojunction, and hence divided into two layers positioned at different depths from the surface, i.e., spaced from the gate electrode by different distances. These two electron gas layers are affected differently by the gate voltage. As a result, it has been considered that the mutual conductance depends largely on the gate voltage.

According to the invention disclosed in the above U.S. patent application, the thickness of the channel layer is limited to such a value, specifically in the range of from 50 Å to 150 Å, as to regard the density of the electron gas in the channel layer as being substantially uniform, and the resistance of the upper and lower AlGaAs layers which are positioned adjacent to the thin channel layer is of a high value. The resistance of the upper and lower AlGaAs layers is high because as it increases, the effect of the gate voltage applies to a wider range including the channel layer, resulting in the same advantage as would be achieved if the channel layer thickness were reduced.

FIG. 1 of the accompanying drawings shows experimental data on electric characteristics of the high electron mobility transistor disclosed in the above U.S. patent application. The experimental data show the relationship between the drain voltage and the drain current when the gate voltage was varied stepwise. It can be seen from FIG. 1 that the drain current increases in a substantially uniform pattern as the gate voltage increases, and hence the mutual conductance does not vary largely depending on the gate voltage.

FIG. 2 of the accompanying drawings is a graph showing experimental data on the relationship between the mutual conductance and the gate voltage of the high electron mobility transistor disclosed in the above U.S. patent application and other conventional high electron mobility transistors. The vertical axis of the graph represents the mutual conductance (gm) per unit gate width and the horizontal axis the gate voltage. A solid-line curve A indicates the data of the high electron mobility transistor disclosed in the above U.S. patent application. A dotted-line curve B indicates the data of a conventional high electron mobility transistor. A dot-and-dash-line curve C indicates the data of an improved conventional high electron mobility transistor. The experimental data shown in FIG. 2 support the effectiveness of the high electron mobility transistor disclosed in the above U.S. patent application.

In the high electron mobility transistor disclosed in the above U.S. patent application, the electron gas produced in the channel layer is both physically integrated by the thickness of the channel layer and functionally integrated by the high resistance of the AlGaAs layers adjacent to the channel layer, providing the good mutual conductance characteristics shown in FIGS. 1 and 2. However, since the resistance of the upper AlGaAs layer over the channel layer is increased for improving the mutual conductance characteristics, the gate electrode imposes an excessive effect on the channel layer, tending to cause the threshold voltage to be of too a small negative value.

SUMMARY OF THE INVENTION

It is therefore an object of the present invention to provide a high electron mobility transistor which is capable of achieving lower-threshold characteristics while maintaining good mutual conductance characteristics.

According to the present invention, there is provided a high electron mobility transistor comprising a double-heterojunction structure comprising a channel layer for developing therein an electron gas layer having a substantially uniform electron gas density, and upper and lower high-resistance wide-band gap layers disposed respectively over and beneath the channel layer, each of the upper and lower high-resistance wide-band gap layers having a silicon-doped planar layer disposed therein, the upper high-resistance wide-band gap layer including a low-resistance wide-band gap layer disposed in an upper end region thereof remotely from the channel layer.

The low-resistance wide-band gap layer is doped with an impurity at a concentration ranging from $3 \times 10^{17}$ cm$^{-3}$ to $1 \times 10^{18}$ cm$^{-3}$ and has a thickness ranging from 40 Å to 120 Å. The channel layer has a thickness ranging from 50 Å to 150 Å. The upper and lower high-resistance wide-band gap layers are of a symmetrical structure with respect to the channel layer disposed therebetween.

According to the present invention, there is also provided a high electron mobility transistor comprising a double-heterojunction structure comprising a channel layer and upper and lower high-resistance wide-band gap layers disposed respectively over and beneath the channel layer, each of the upper and lower high-resistance wide-band gap layers having a silicon-doped planar layer disposed therein, the upper high-resistance wide-band gap layer including a low-resistance wide-band gap layer disposed in an upper end region thereof remotely from the channel layer.

The above and other objects, features, and advantages of the present invention will become apparent from the following description when taken in conjunction with the accompanying drawings which illustrate a preferred embodiment of the present invention by way of example.

DETAILED DESCRIPTION OF THE PREFERRED EMBODIMENT

Figure 1:
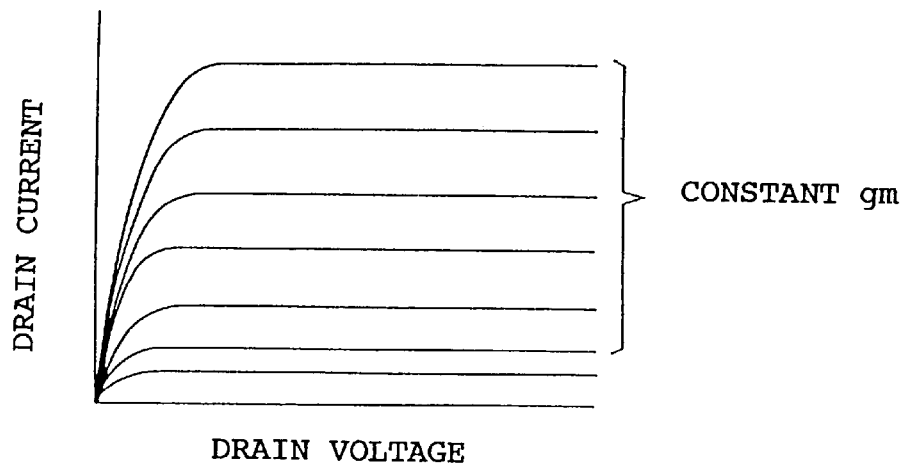
FIG. 1 is a graph showing experimental data on electric characteristics of a conventional high electron mobility transistor disclosed in a prior U.S. patent application.
Figure 2:
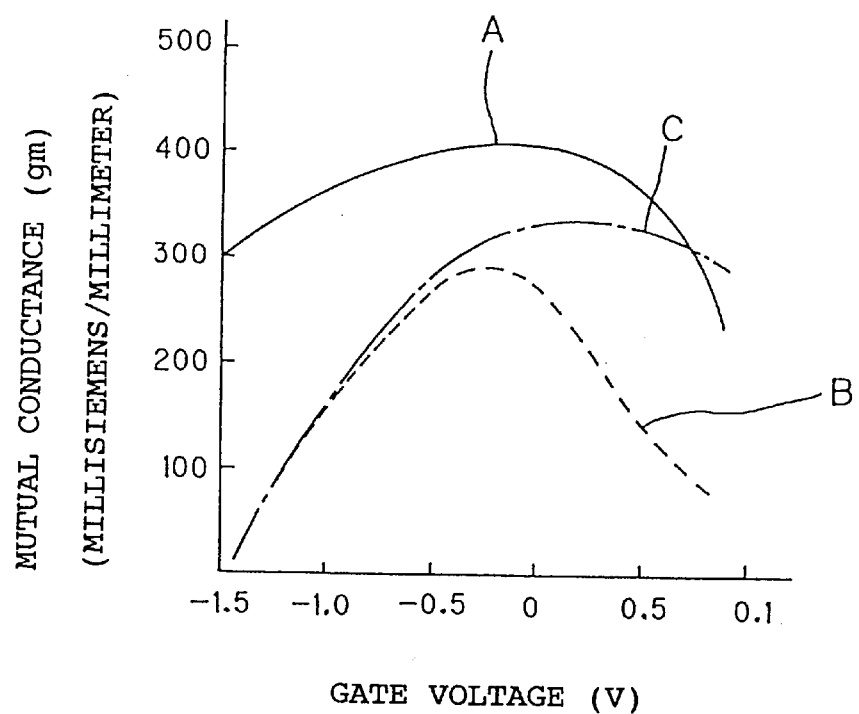
FIG. 2 is a graph showing experimental data on the relationship between the mutual conductance and the gate voltage of the high electron mobility transistor disclosed in the prior U.S. patent application and other conventional high electron mobility transistors.
Figure 3:
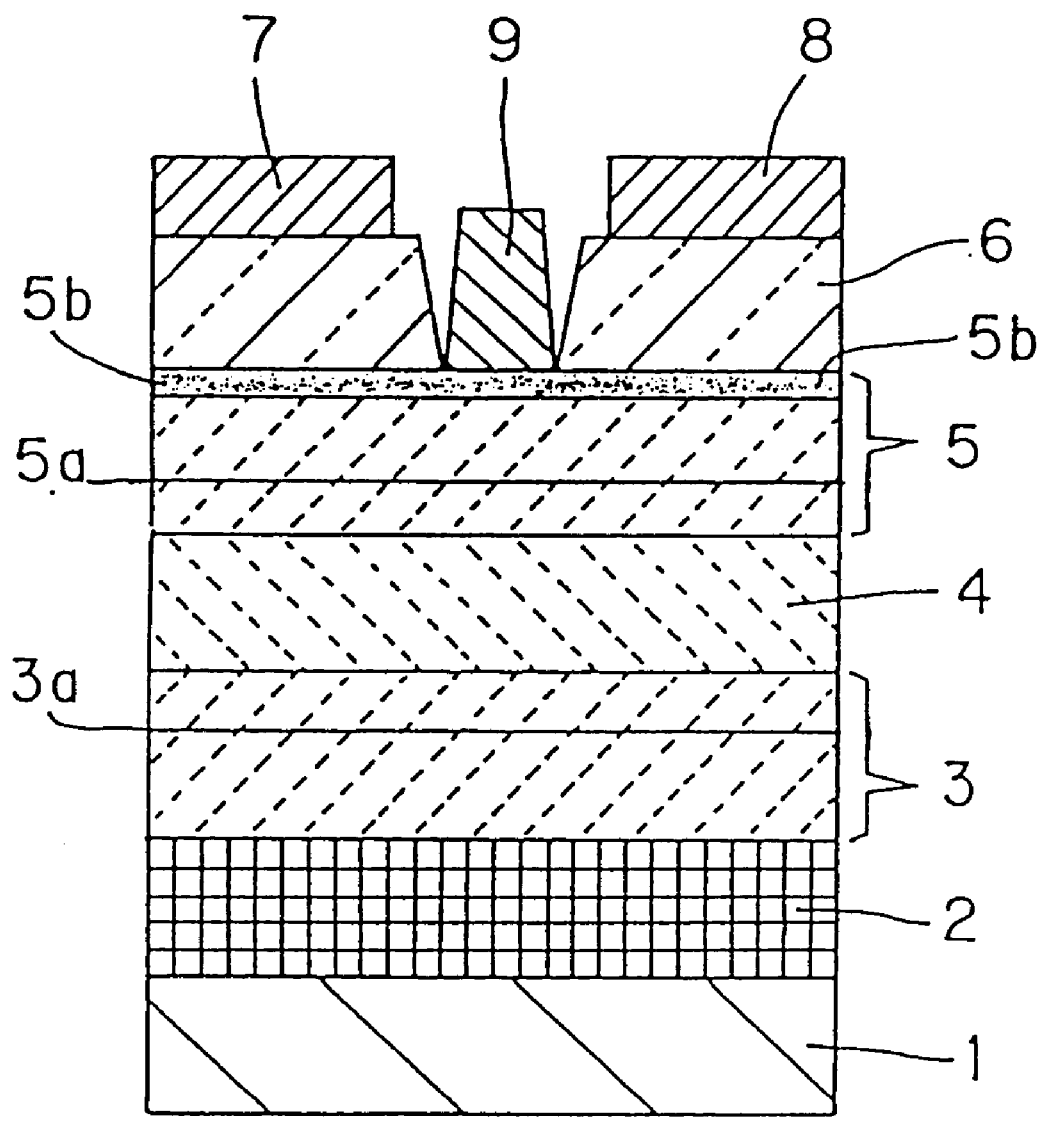
FIG. 3 is a fragmentary cross-sectional view of a high electron mobility transistor according to the present invention.

As shown in FIG. 3, a high electron mobility transistor according to the present invention has a semi-insulating GaAs substrate 1, a superlattice buffer layer 2 disposed on the semi-insulating GaAs substrate 1, a double-heterojunction structure disposed on the superlattice buffer layer 2 and including a pair of lower and upper high-resistance AlGaAs wide-band gap layers 3, 5 and an InGaAs channel layer 4 disposed between the lower and upper AlGaAs wide-band gap layers 3, 5, an n$^+$ contact layer 6 disposed on the upper AlGaAs wide-band gap layer 5, a source electrode 7 disposed on the n$^+$ contact layer 6, a drain electrode 8 disposed on the n$^+$ contact layer 6, and a gate electrode 9 disposed on the upper AlGaAs wide-band gap layer 5.

The superlattice buffer layer 2 disposed on the semi-insulating GaAs substrate 1 serves to prevent an unwanted carrier from leaking. The AlGaAs wide-band gap layer 3 disposed on the superlattice buffer layer 2 has a thickness of about 330 Å and is made of $Al_xGa_{1-x}As$ (0.2<x<0.3). The AlGaAs wide-band gap layer 3 includes a silicon-doped planar layer 3a which contains an impurity of silicon (Si) at an a real density of $2.5 \times 10^{12}$ cm$^{-2}$ and which is positioned at a location that is 30 Å spaced from the heterojunction between the AlGaAs wide-band gap layer 3 and the channel layer 4.

The channel layer 4 has a thickness which is selected to be of a value small enough to cause two electron gas layers, which would otherwise be separated away from each other in the vicinity of heterojunctions formed between the channel layer 4 and the lower and upper AlGaAs wide-band gap layers 3, 5, to be combined into a single electron gas layer that is controllable depending on changes in the gate voltage applied to the gate electrode. Specifically, the thickness of the channel layer 24 is in the range of from 50 Å to 150 Å.

The AlGaAs wide-band gap layer 5 disposed on the channel layer 4 has a thickness of about 250 Å and is made of $Al_xGa_{1-x}As$ (0.2<x<0.3) The AlGaAs wide-band gap layer 5 also includes a silicon-doped planar layer 5a which contains an impurity of Si at an areal density of $2.5 \times 10^{12}$ cm$^{-2}$ and which is positioned at a location that is 30 Å spaced from the heterojunction between the AlGaAs wide-band gap layer 5 and the channel layer 4. Therefore, the channel layer 4 and the lower and upper AlGaAs wide-band gap layers 3, 5 are of a vertically symmetrical structure with respect to the horizontal central axis of the channel layer 4.

According to the present invention, the AlGaAs wide-band gap layer 5 includes a low-resistance AlGaAs wide-band gap layer 5b disposed in an upper end region thereof and doped with Si at a concentration ranging from $3 \times 10^{17}$ cm$^{-3}$ to $1 \times 10^{18}$ cm$^{-3}$, the low-resistance AlGaAs wide-band gap layer 5b having a thickness ranging from 40 Å to 120 Å and preferably of 80 Å. The n$^+$ contact layer 6, which is disposed on the low-resistance AlGaAs wide-band gap layer 5b, is doped with Si at a concentration of $5 \times 10^{18}$ cm$^{-3}$ and has a thickness of 500 Å.

Because the low-resistance AlGaAs wide-band gap layer 5b is positioned immediately below the gate electrode 9, when a voltage applied to the gate electrode 9 is low, a depletion layer developed immediately below the gate electrode 9 is prevented from spreading by the low-resistance AlGaAs wide-band gap layer 5b. Specifically, as long as the voltage applied to the gate electrode 9 is low, the depletion layer developed immediately below the gate electrode 9 does not spread through the wide-band gap layer 5b into the lower region of the AlGaAs wide-band gap layer 5. Therefore, the high electron mobility transistor is in a normally-on state.

Because the thickness of the low-resistance AlGaAs wide-band gap layer 5b is of a relatively small value of 80 Å, when the voltage applied to the gate electrode 9 varies, the depletion layer developed immediately below the gate electrode 9 spreads quickly through the wide-band gap layer 5b into the lower region of the AlGaAs wide-band gap layer 5, starting to affect the behavior of an electron gas produced in the channel layer 4.

When the voltage applied to the gate electrode 9, i.e., the gate voltage, varies, the spreading of the depeletion layer, more precisely, a change in the potential of each of regions in the vicinity of the channel layer 4, varies to a greater degree as the resistance of the wide-band gap layer 5 increases. The greater the variation in the spreading of the depletion layer per unit gate voltage becomes with respect to the width of the channel layer 4, the greater the tendency of the gate voltage to affect the channel layer 4, causing the electron gas in the channel layer 4 to behave in a more integrated manner, so that the high electron mobility transistor has improved mutual conductance characteristics.

As described above, inasmuch as the channel layer 4 has a relatively small thickness and the lower and upper AlGaAs wide-band gap layers 3, 5 positioned adjacent to the channel layer 4 have a relatively high resistance, the electron gas produced in the channel layer 4 is both physically integrated by the thickness of the channel layer 4 and functionally integrated by the high resistance of the AlGaAs wide-band gap layers 3, 5 adjacent to the channel layer, providing good mutual conductance characteristics. The electron gas thus integrated is highly responsive to the gate voltage, resulting in the improved mutual conductance characteristics.

According to a conventional high electron mobility transistor typically disclosed in Japanese patent publication No. 1-56542, the upper wide-band gap layer, corresponding to the upper wide-band gap layer 5, has a medium resistance value uniformly throughout the upper wide-band gap layer. This is because the upper wide-band gap layer cannot have a relatively large resistance since it is responsible for the supply of electrons into the channel layer.

According to the present invention, however, the silicon-doped planar layers 3a, 5a are fully responsible for supplying electrons into the channel layer 4, and the region of the wide-band gap layer 5 in the vicinity of the channel layer 4 has a considerably high resistance whereas the wide-band gap layer 5b immediately below the gate electrode 9 is considerably thin and has a considerably low resistance. Consequently, adjustments to make the high electron mobility transistor normally-on or normally-off can be made by adjusting the density of the doped impurity and the thickness of the wide-band gap layer 5b. Therefore, the mutual conductance characteristics can be improved and the threshold voltage can be established independently of each other.

In the illustrated embodiment, the wide-band gap layers 3, 5 adjacent to the channel layer 4 have a relatively high resistance and the channel layer 4 has a relatively small thickness limited to a certain range. However, the thickness of the channel layer 4 may not be limited to such a range, and the mutual conductance characteristics may be improved by only increasing the resistance of the wide-band gap layers 3, 5 adjacent to the channel layer 4.

The wide-band gap layers 3, 5 are made of AlGaAs and the channel layer 4 as a narrow-band gap layer is made of InGaAs in the illustrated embodiment. However, any combination of semiconductor crystals may be used which have the same relation as described above with respect to the widths of the band gaps (forbidden bands) or the magnitude of electron affinity.

Although a certain preferred embodiment of the present invention has been shown and described in detail, it should be understood that various changes and modifications may be made therein without departing from the scope of the appended claims.

What is claimed is:

1. A high electron mobility transistor comprising:
    a double-heterojunction structure comprising:
        a channel layer for developing therein an electron gas layer having a substantially uniform electron gas density; and
        upper and lower high-resistance wide-band gap layers disposed respectively over and beneath said channel layer, each of said upper and lower high-resistance wide-band gap layers having a silicon-doped planar layer disposed therein;
        said upper high-resistance wide-band gap layer including a low-resistance wide-band gap layer disposed in an upper end region thereof remotely from said channel layer, and
        wherein said low-resistance wide-band gap layer is doped with an impurity at a concentration ranging from $3\times10^{17}$ cm$^{-3}$ to $1\times10^{18}$ cm$^{-3}$ and has a thickness ranging from 40 Å to 120 Å.

2. A high electron mobility transistor according to claim 1, wherein said channel layer has a thickness ranging from 50 Å to 150 Å.

3. A high electron mobility transistor according to claim 1, wherein said upper and lower high-resistance wide-band gap layers are of a symmetrical structure with respect to said channel layer disposed therebetween.

4. A high electron mobility transistor according to claim 1, wherein said low-resistance-wide band gap layer has a thickness of approximately 80 Å.

5. A high electron mobility transistor according to claim 2 including a contact layer disposed on said low-resistance wide-band gap layer and has a thickness of approximately 500 Å.

\* \* \* \* \*

UNITED STATES PATENT AND TRADEMARK OFFICE
CERTIFICATE OF CORRECTION

PATENT NO. : 5,900,653
DATED : May 4, 1999
INVENTOR(S) : Toshifumi Suzuki, et al.

It is certified that error appears in the above-identified patent and that said Letters Patent is hereby corrected as shown below:

Column 6, line 31, please change "2" to -- 1 --.

Signed and Sealed this

Eleventh Day of January, 2000

Attest:

Q. TODD DICKINSON

Attesting Officer

Acting Commissioner of Patents and Trademarks